US010144633B2

(12) United States Patent
Berenschot et al.

(10) Patent No.: US 10,144,633 B2
(45) Date of Patent: Dec. 4, 2018

(54) METHOD OF MANUFACTURING A PLURALITY OF THROUGH-HOLES IN A LAYER OF MATERIAL

(71) Applicant: UNIVERSITEIT TWENTE, Enschede (NL)

(72) Inventors: Johan Willem Berenschot, Winterswijk (NL); Niels Roelof Tas, Enschede (NL)

(73) Assignee: Universiteit Twente, Enschede (NL)

( * ) Notice: Subject to any disclaimer, the term of this patent is extended or adjusted under 35 U.S.C. 154(b) by 165 days.

(21) Appl. No.: 15/443,898

(22) Filed: Feb. 27, 2017

(65) Prior Publication Data
US 2017/0247243 A1    Aug. 31, 2017

(30) Foreign Application Priority Data

Feb. 25, 2016    (EP) ..................... 16157427

(51) Int. Cl.
*B81B 1/00*    (2006.01)
*B81C 1/00*    (2006.01)

(52) U.S. Cl.
CPC .......... *B81B 1/004* (2013.01); *B81C 1/00087* (2013.01); *B81C 1/00111* (2013.01); *B81B 2201/057* (2013.01); *B81B 2203/0118* (2013.01); *B81B 2203/0315* (2013.01);
(Continued)

(58) Field of Classification Search
CPC ............ B81B 1/004; B81B 2203/0369; B81B 2203/036; B81C 1/00111; B81C 2201/0132
See application file for complete search history.

(56) References Cited

U.S. PATENT DOCUMENTS

| | | |
|---|---|---|
| 6,156,215 A | 12/2000 | Shimada et al. |
| 2006/0165957 A1* | 7/2006 | Oesterschulze ..... B81C 1/00087 428/131 |
| 2013/0305519 A1* | 11/2013 | Sarajlic ............... B81C 1/00119 29/592.1 |

FOREIGN PATENT DOCUMENTS

WO    2012/098571 A1    7/2012

OTHER PUBLICATIONS

Berenschot, Erwin J. W. et al., "Fabrication of 2D-extruded fractal structures using repeated corner lithography and etching", 9th IEEE Int'l Conf. Nano/Micro Engineered and Molecular Systems (NEMS), Apr. 13, 2014, pp. 374-377.*

(Continued)

*Primary Examiner* — Jay C Chang
(74) *Attorney, Agent, or Firm* — Shewchuk IP Services, LLC; Jeffrey D. Shewchuk

(57) ABSTRACT

A method of manufacturing a plurality of through-holes (132) in a layer of material by subjecting the layer to directional dry etching to provide through-holes (132) in the layer of material; For batch-wise production, the method comprises
after a step of providing a layer of first material (220) on base material and before the step of directional dry etching, providing a plurality of holes at the central locations of pits (210),
etching base material at the central locations of the pits (210) so as to form a cavity (280) with an aperture (281),
depositing a second layer of material (240) on the base material in the cavity (280), and
subjecting the second layer of material (240) in the cavity (280) to said step of directional dry etching using the aperture (281) as the opening (141) of a shadow mask.

8 Claims, 8 Drawing Sheets

(52) U.S. Cl.
CPC .......... *B81B 2203/0361* (2013.01); *B81B 2203/0369* (2013.01); *B81C 2201/0132* (2013.01)

(56) References Cited

OTHER PUBLICATIONS

E. Sarajlic et al., Design, Fabrication and Characterization of an In-Plane AFM Probe With Ultra-Sharp Silicon Nitride Tip, Proceedings of the 21st Micromechanics and Micro Systems Eiurope Workshop (MME 2010), Sep. 26, 2010, pp. 24-27, Enschede, Netherlands.

Berenschot, Erwin J. W. et al., Fabrication of 2D-extruded fractal structures using repeated corner lithography and etching, 9th IEEE Int'l Conf Nano/Micro Engineered and Molecular Systems (NEMS), Apr. 13, 2014, pp. 374-377.

Deladi, S. et al., Fabrication of Micromachined Fountain Pen With In Situ Characterization Possibility of Nanoscale Surface Modification, Journal of Micromechanics & Microengineering, vol. 15, No. 3, Mar. 1, 2005, pp. 528-534, Institute of Physics Publishing, Bristol GB.

\* cited by examiner

METHOD OF MANUFACTURING A PLURALITY OF THROUGH-HOLES IN A LAYER OF MATERIAL

The present invention relates to a method of manufacturing a plurality of through-holes in a layer of material.

US2006/0165957 discloses a method of method of manufacturing a plurality of through-holes in a layer of material wherein an intermediate product is subjected to a plurality of method steps, the intermediate product
  defining a first side and a second side, and
  comprises a base substrate, said base substrate comprising a base material, wherein at the first side the surface of the base substrate defines a main plane;
  wherein the plurality of method steps comprises the steps of
    providing the base substrate of the intermediate product at the first side with a plurality of pits in said base material,
    providing the base substrate with the layer of first material at the first side of the intermediate product, the first material being different from the base material so as to result in the intermediate product having pits comprising a layer of said first material,
    providing a plurality of holes in the layer of first material at the central locations of the pits, and
    subjecting the intermediate product to directional dry etching to provide holes in the base substrate.

Through-holes are provided by etching from the second side.

Various MEMS devices, such as i) probes comprising a hollow cantilever or ii) sieves, comprise at least one through-hole in a layer of first material such as silicon nitride. The through-hole is for example in a face of a pyramidal tip of the cantilever of a MEMS probe. MEMS probes comprising hollow cantilevers having a tip are used in life sciences for a variety of purposes, two of them being the delivery of a substance to or extraction of material from a cell. In that case, the tip of the MEMS probe will have to penetrate through the cell wall. Material of the cell wall should not clog the opening at the tip of the probe. For this reason, preference is given to probes having the opening (through-hole) in a side wall or pyramidal edge of the tip, instead of at the tip's distal end. In the art, probes with a cantilever comprising a conduit and having a tip are routinely produced. To create the opening of the conduit at the tip, use is made of ion beam etching, wherein a beam of ions is accurately aimed and focussed on a wall of a tip to locally etch said wall and form the through-hole.

While MEMS techniques allow MEMS devices such as probes comprising cantilevers having a tip to be manufactured in large numbers simultaneously, this step of creating the opening (a through-hole) at the tip, has to be performed for each tip individually and consecutively, which is time consuming and costly. Also, there is a risk of damage to the opposite wall of the tip once the focussed beam has penetrated the wall of the tip.

The objective of the present invention is to provide a method allowing for the creation of through-holes in a batch process, i.e. simultaneously creating a multitude of through-holes.

It is a further object of the present invention to provide a method allowing for the batch-wise production of through-holes in pits comprising a layer of the first material.

To this end, a method according to the preamble is characterized in that an intermediate product is subjected to a plurality of method steps, the intermediate product
  defining a first side and a second side, and
  comprises a base substrate, said base substrate comprising a base material, wherein at the first side the surface of the base substrate defines a main plane;
  wherein the plurality of method steps comprises the steps of
    providing the base substrate of the intermediate product at the first side with a plurality of pits in said base material, and
    providing the base substrate with the layer of first material at the first side of the intermediate product, the first material being different from the base material so as to result in the intermediate product having pits comprising a layer of said first material,
    providing a plurality of holes in the layer of first material at the central locations of the pits,
    etching the base material at the central locations of the pits of the intermediate product so as to form a cavity separated from the first side by an aperture defining a waist,
    depositing a second layer of material on the base material in the cavity, the second material being different from the base material, and
    subjecting the first side of the base substrate provided with the second layer of material as the layer to said step of directional dry etching using the aperture as the opening of a shadow mask to provide through-holes in the layer of second material.

Thus, the second layer of material in contact with the material of the base substrate is subjected to directional dry etching, as a result of which a hole is formed in said second layer of material. The method is suitable for both distal through-holes and non-distal through-holes. The material of said layer of material deposited (which term includes grown) on the base material in the cavity, in case of crystalline base material typically a polygonal cavity such as an octahedral cavity, will typically be the same as the material of the first layer but may be different and the second material is different from the base material. Subsequent removal of base material at the location of the pits will result in a through-hole accessible from both the first side and the second side.

In the present application, the base substrate will in general be a wafer, such as a wafer of crystalline base material. The wafer is for example a silicon wafer, which may be used to manufacture probes comprising four-sided pyramidal tips, as desired, depending on the crystal orientation of the starting wafer with respect to the base main plane. For the manufacture of probes comprising four-sided pyramidal tips this is 100 silicon. The step of depositing a second layer of material on the base material in the cavity results in a tip section, which in case of anisotropic etching of a crystalline base material will be a polygonal tip section that is separated from the base of the tip by the aperture (a waist). The through-hole is made in the material (i.e. in at least one wall) of the tip section.

The central location of a pit is the location where the pit is the deepest. Typically the holes are concentric holes.

The method according to the invention is less sensitive to the processing conditions of the step of directional dry etching, because over etching merely results in damage to the base material of the substrate, which for many applications will be removed anyway.

After locally penetrating the second layer of material deposited in the cavity on the base material, the method will be continued using any conventional steps for manufacturing the MEMS device that is desired. By way of example, for a probe comprising a hollow conduit, a sacrificial conduit layer will be provided, followed by further wall material for the conduit covering said sacrificial conduit layer, and etching to remove the sacrificial conduit layer material, so as to result in a hollow conduit. Removing base material at the location of the pyramidal pit will result in a freely extending cantilever.

According to a favourable embodiment, removing base material of the base substrate exposing the through-holes in the second layer of material.

It is preferred to remove the base material after creating the through-holes in the second layer, instead of before.

According to a favourable embodiment, the step of directional dry etching using the aperture as the opening of a shadow mask, is performed with said direction being at an angle α to the normal to the base main plane of at least 5°.

Thus it is possible to create through-holes in the second material at a distance from the bottom end of the cavity.

According to a favourable embodiment, the method comprises at least one further method step for manufacturing a plurality of MEMS devices, a MEMS device comprising a through-hole in the material of a wall of the cavity, said through-hole formed by the step of directional dry etching using the aperture as the opening of a shadow mask.

A typical MEMS device according to the present invention is a probe, e.g. for taking a sample from a cell, or introducing material into a cell.

According to a favourable embodiment, the method comprises further steps for manufacturing a plurality of probes wherein each probe of the plurality of probes comprises
  a probe base section
    having a probe base main plane, and
    comprising a first opening of a conduit; and
  a cantilever protruding from said probe base section parallel with the probe base main plane, said cantilever having
    a proximal end connected to the probe base section, and
    a distal cantilever end;
  said cantilever comprising a tip having a distal tip end, said tip comprising a second opening of said conduit at a location away from the distal tip end;
wherein the second opening is formed by at least one step comprising the step of directional dry etching using the aperture as the opening of a shadow mask.

MEMS probes are an important application area and for the state of the art forming the second holes in a face of the tip is a major cost factor because so far they had to be milled individually with accurate aiming of an ion beam. The present invention does not require ion beam milling individual tips. The term "in a face" does not exclude that the hole is in two adjacent faces, i.e. crossing a pyramidal ridge.

According to a favourable embodiment, the probe comprises a hollow cantilever.

This is an important application area of the method according to the invention.

According to a favourable embodiment, the base material is a crystalline base material, and before the base substrate is provided with the first layer of first material, the method comprises the step of
  etching the base substrate at the first side to form a plurality of pits in said crystalline base material, the pits comprising a face that is at an angle to the main plane.

Pits are typically formed using anisotropic etching of the base material, which allows for the formation of pyramidal pits. Thus MEMS techniques allow for the manufacture of probes having a sharp pyramidal tip. With a probe comprising a sharp tip, excessive damage to the cell is to be avoided. The probe may also serve a dual role, because the tip may be used for scanning using one of a variety of scanning techniques known in the art. A typical crystalline base material used in the art is silicon (1, 0, 0).

The face will extend along a crystal plane of the base material.

According to a favourable embodiment, the step of directional dry etching is performed using reactive ion etching.

This is a convenient manner to perform the method.

Phrased in two-part from, the invention relates to a method of manufacturing a plurality of through-holes in a layer of material
  wherein an intermediate product is subjected to a plurality of method steps, the intermediate product
    defining a first side and a second side, and
    comprises a base substrate, said base substrate comprising a base material, wherein at the first side the surface of the base substrate defines a main plane;
  wherein the plurality of method steps comprises the steps of
    providing the base substrate of the intermediate product at the first side with a plurality of pits in said base material, and
    providing the base substrate with the layer of first material at the first side of the intermediate product, the first material being different from the base material so as to result in the intermediate product having pits comprising a layer of said first material, and
    subjecting the intermediate product to directional dry etching to provide through-holes in the layer of material;
  characterized in that the method further comprises
    after the step of providing the layer of first material and before the step of directional dry etching, providing a plurality of holes in the layer of first material at the central locations of the pits,
    etching the base material at the central locations of the pits of the intermediate product so as to form a cavity separated from the first side by an aperture,
    depositing a second layer of material on the base material in the cavity, and
    subjecting the first side of the base substrate provided with the second layer of material as the layer to said step of directional dry etching using the aperture as the opening of a shadow mask. In conjunction with this, it relates to all the appended subclaims as well.

The present invention will now be illustrated with reference to the drawing where FIG. 1 shows a probe as can be manufactured using the method according to the invention, in top view (top) and cross-sectional view (bottom), both views being vertically aligned;

Figure 1:
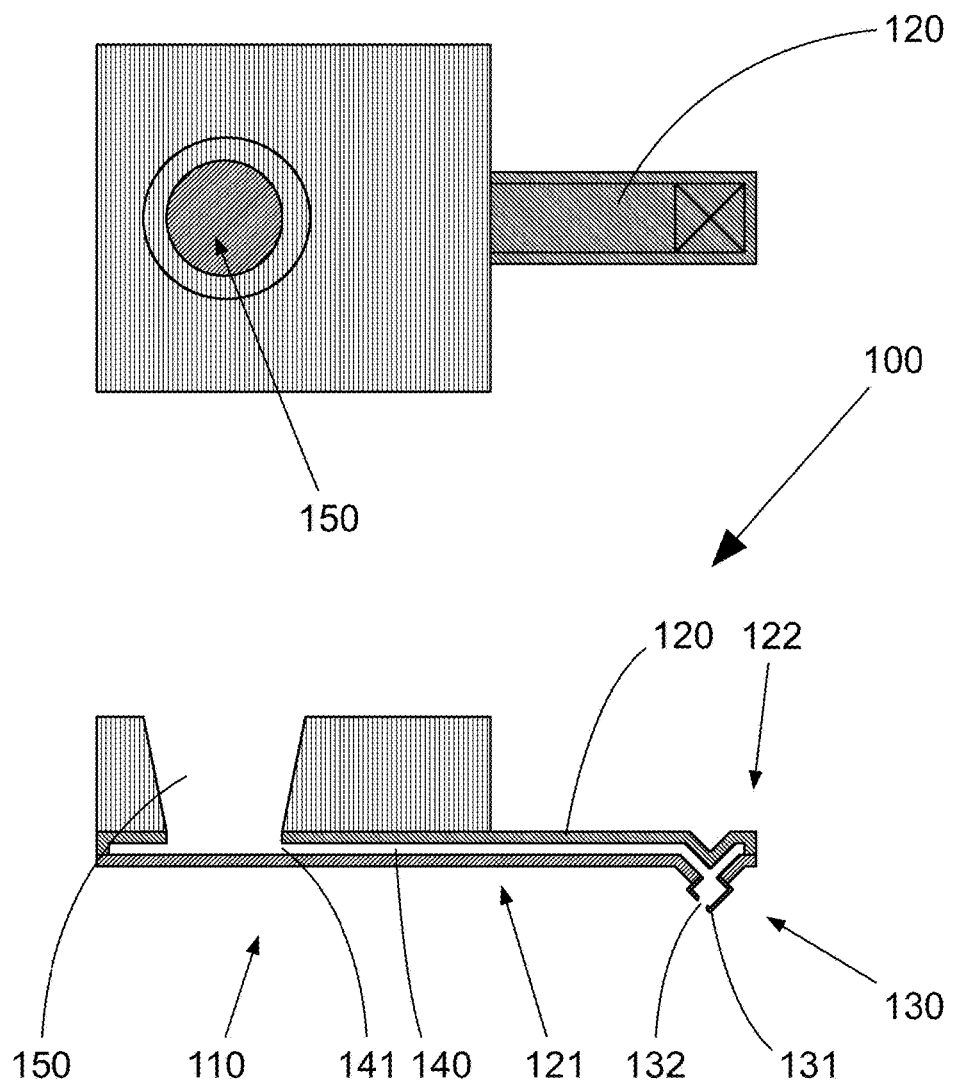
FIG. 1 shows a probe 100 as can be manufactured using the method according to the invention, in top view (top) and cross-sectional view (bottom), both views being vertically aligned.

The probe 100 comprises a probe base section 110 and a cantilever 120 extending from the probe base section 110. The cantilever 120 has a proximal end 121 connected to the probe base section 110 and a distal cantilever end 122.

The distal cantilever end 122 comprises a pyramidal tip 130 comprising at its distal end a polygonal (here octogonal) tip section 131. In a face of the octogonal tip section 131, i.e.

away from the distal end of the pyramidal tip 130, there is a through-hole 132 manufactured in accordance with the present invention.

The probe 100 comprises an elongated conduit 140 extending from a reservoir 150 at the probe base section 110 through the cantilever 120 to the through-hole 132.

The conduit 140 comprises a first opening 141 and the second opening is defined by the through-hole 132.

The method according to the invention will now be illustrated using FIG. 2A to FIG. 2K, which show in top view and cross-sectional view a method of manufacturing the probe 100 of FIG. 1. The method according to the present invention allows for a multitude of through-holes 132 and hence probes 100 to be manufactured at once, but the figures will show one probe 100 in the making only.

A silicon wafer 200 having a thickness of 380 um is shown (FIG. 2A) in top view. The silicon wafer 200 is of (1, 0, 0) silicon.

Figure 2A:
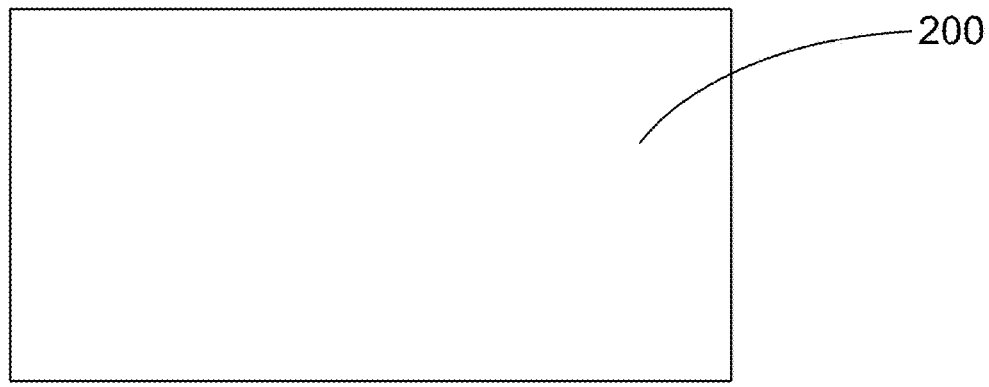
FIG. 2A to FIG. 2K illustrate a method of manufacturing the probe according to FIG. 1 in top view (top) and cross-sectional view (bottom), both views being vertically aligned.
Figure 2A:
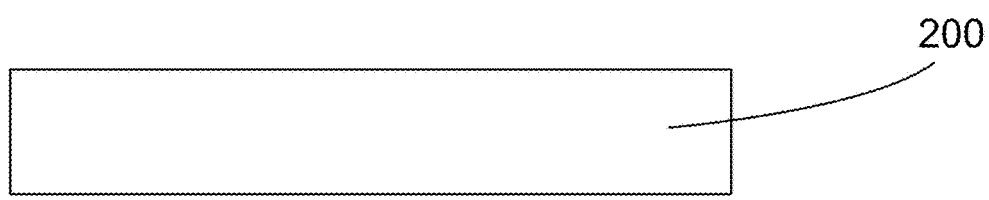
Figure 2B:
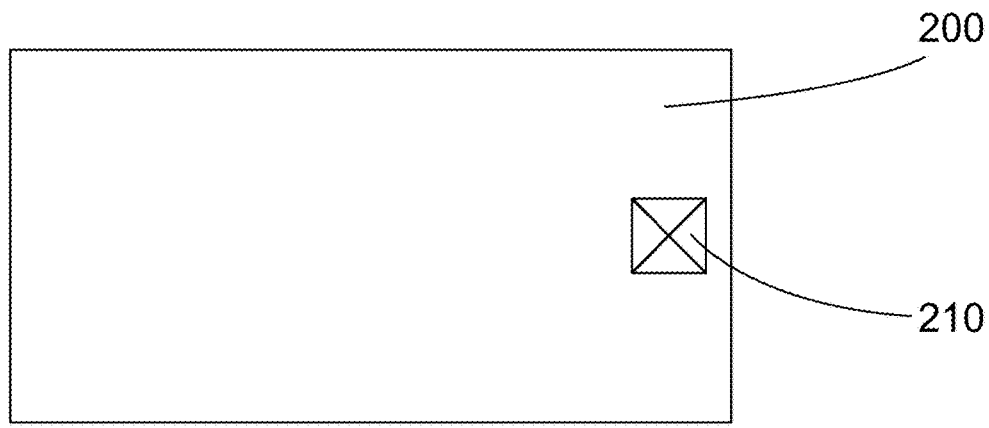
Figure 2B:
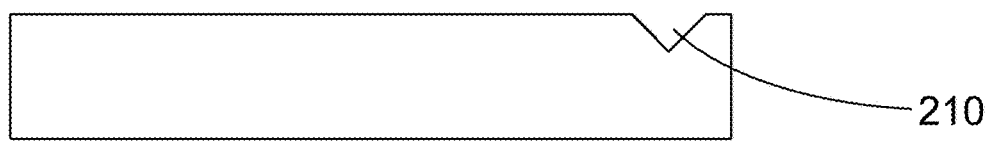

Using a mask, pyramidal pits 210 (only one shown, singulars are used in the remainder of the figure description) is etched by wet anisotropic etching of the silicon using 25% KOH (FIG. 2B). The pyramidal pit 210 is 10 um by 10 um.

Figure 2C:
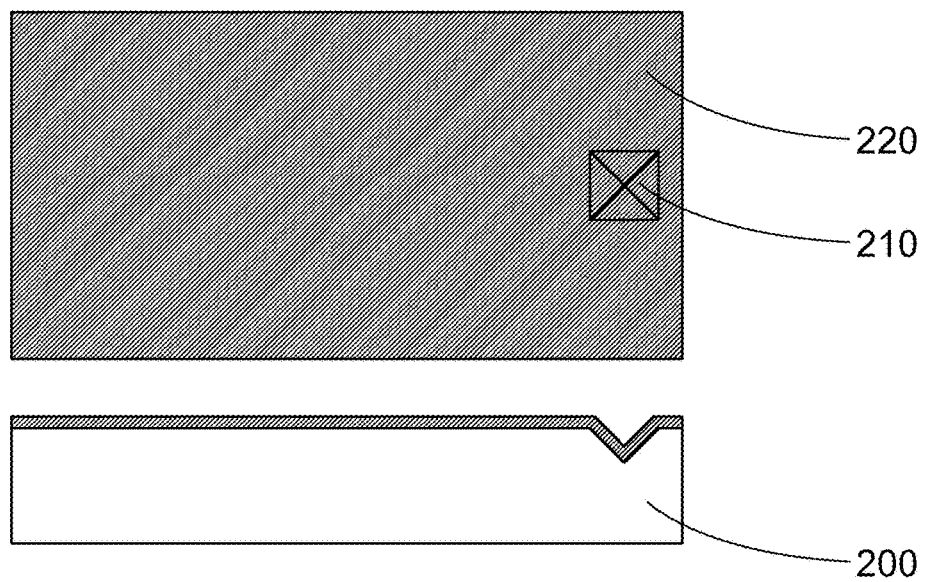

A thin first layer of first material 220 (300 nm), here silicon nitride, is deposited (FIG. 2C) on the silicon wafer 200 comprising a pyramidal pit 210 (FIG. 2C). The silicon nitride will be part of a wall defining the conduit 140 and part of the pyramidal tip 130.

Figure 2D:
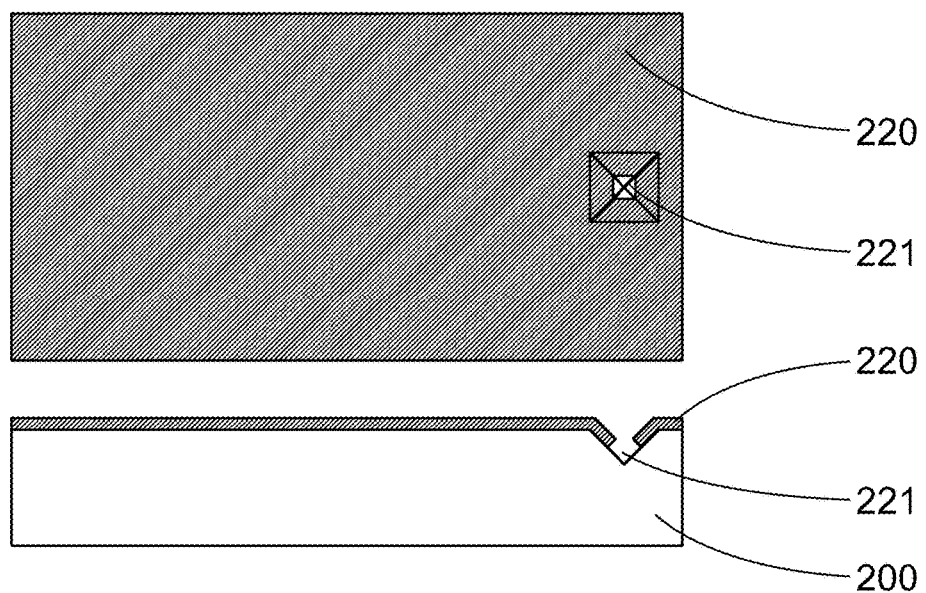

The first layer of first material 220 was provided with a small hole 221 centrally located at the bottom of the pyramidal pit 210 using corner lithography (FIG. 2D).

Other techniques can be used instead, for example deposition of silicon oxide by Low Pressure or Plasma Enhanced Chemical Vapor Deposition (LPCVD or PECVD) followed by optical lithography and silicon nitride etching.

Figure 2E:
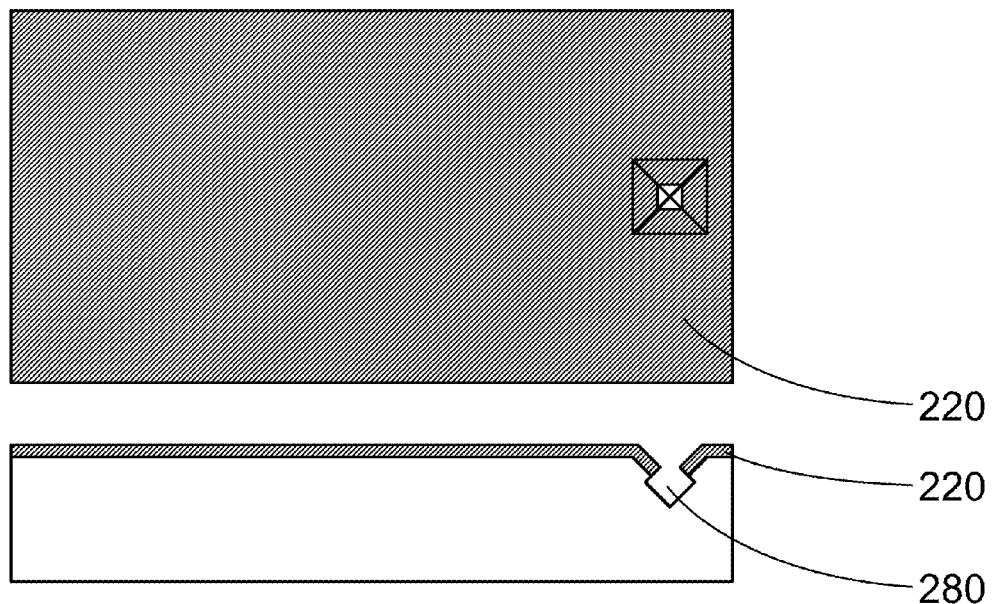

By wet anisotropic etching of silicon through the small opening at the pyramidal apex of the pit 210 an octahedral cavity 280 is realised (FIG. 2E). The size of the octahedral cavity 280 can be controlled by choosing an appropriate etching time.

Figure 2F:
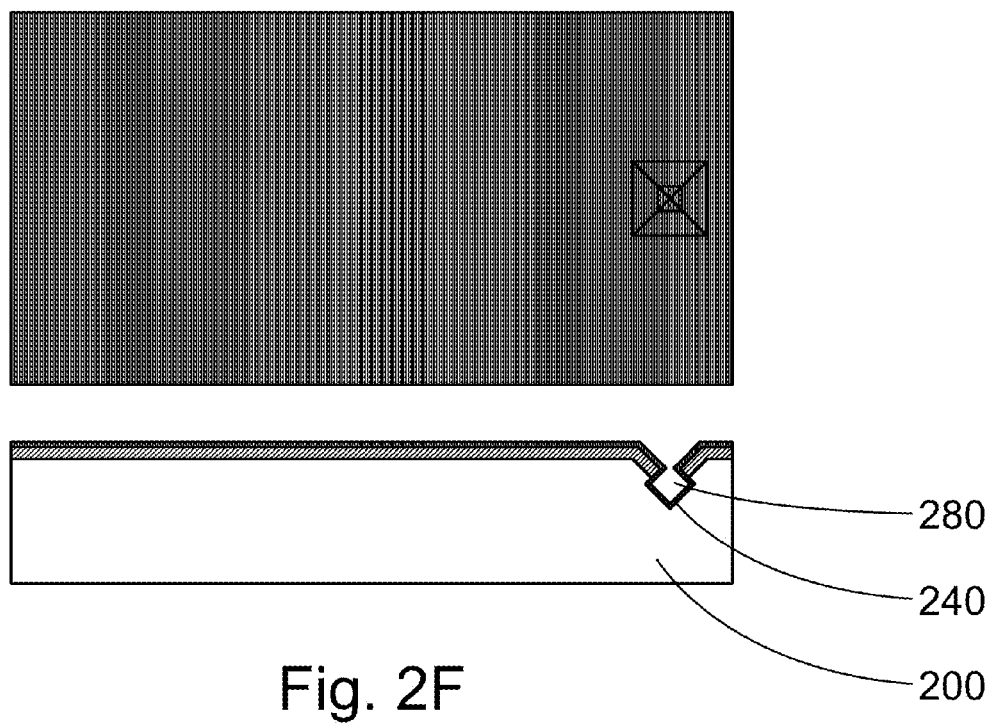
Figure 2G:
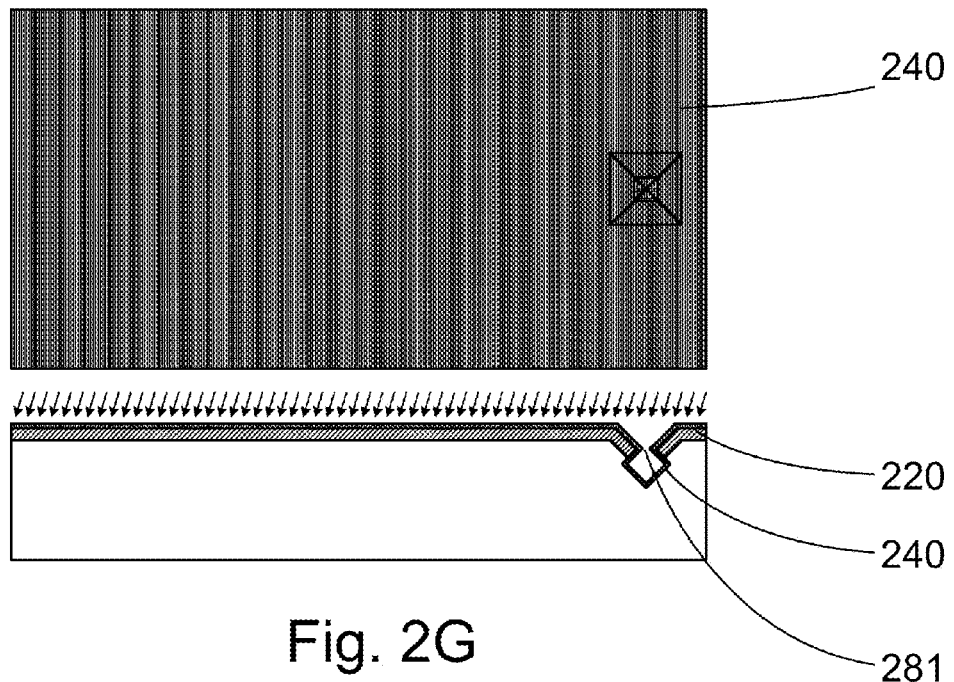

Silicon nitride is deposited, now forming a second layer 240 of material (35 nm) inside the octahedral cavity (FIG. 2F). A constricted aperture 281 (waist) is formed, connecting the lumen of the octahedral cavity 280 with the first side.

The wafer 200 provided with the second layer 240 of silicon nitride is directionally etched (RIE) at an angle α of 35° (FIG. 2G), using constricted aperture 281 as a mask opening for etching the layer of silicon nitride inside the octrahedral cavity 280.

Figure 2H:
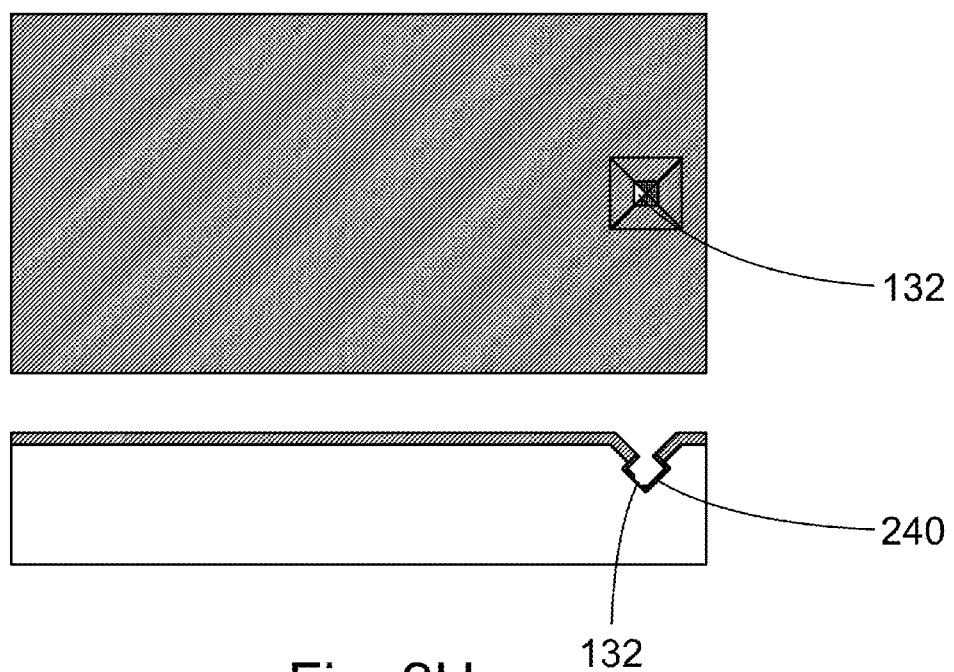

This results in an off-center through-hole 132 in the layer 240 of material (FIG. 2H). Because a plurality of probes is manufactured using the present method, a plurality of through-holes 132 is formed at the same time, and not formed consecutively. The position and size of the through-hole 132 can to some extent be tuned by adjusting the etching angle α.

Figure 2I:
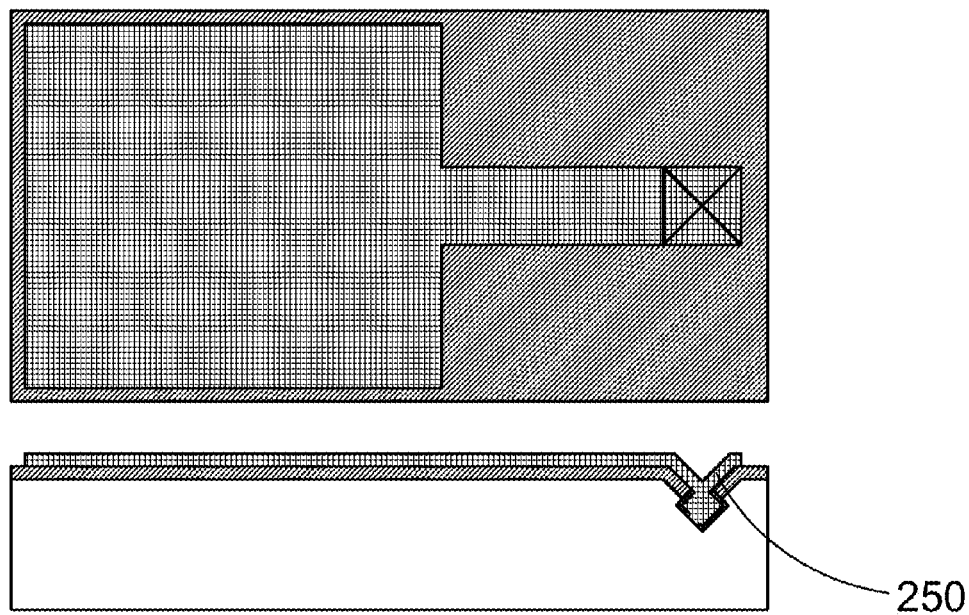

The remainder of the probe 100 is manufactured according to well-known practices, by providing the intermediate product resulting from the previous step with a patterned layer of sacrificial material 250, here polycrystalline silicon with a thickness of 1 um (FIG. 2I).

A further layer 260 of silicon nitride having a thickness of 300 nm is deposited, covering the silicon nitride layer of first material 220 and the layer of sacrificial material 240.

Figure 2J:
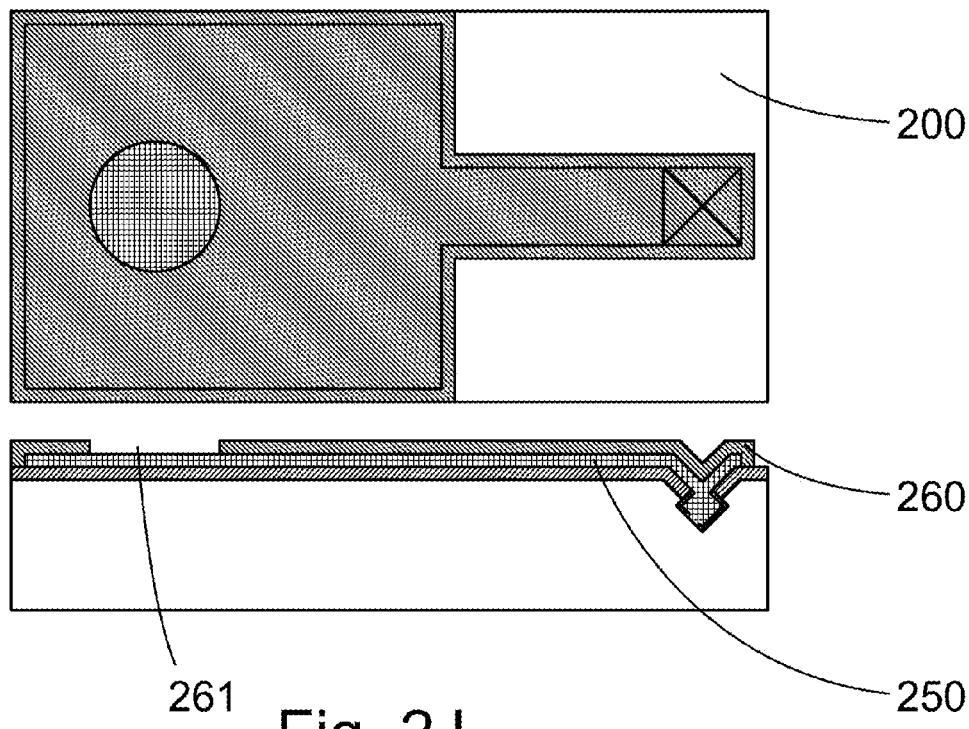

It is subsequently etched by Reactive Ion Etching to create an etching window 261 so as to expose part of the sacrificial layer of material 240 at a location that will later on be at the probe base section 110 (FIG. 2J).

Figure 2K:
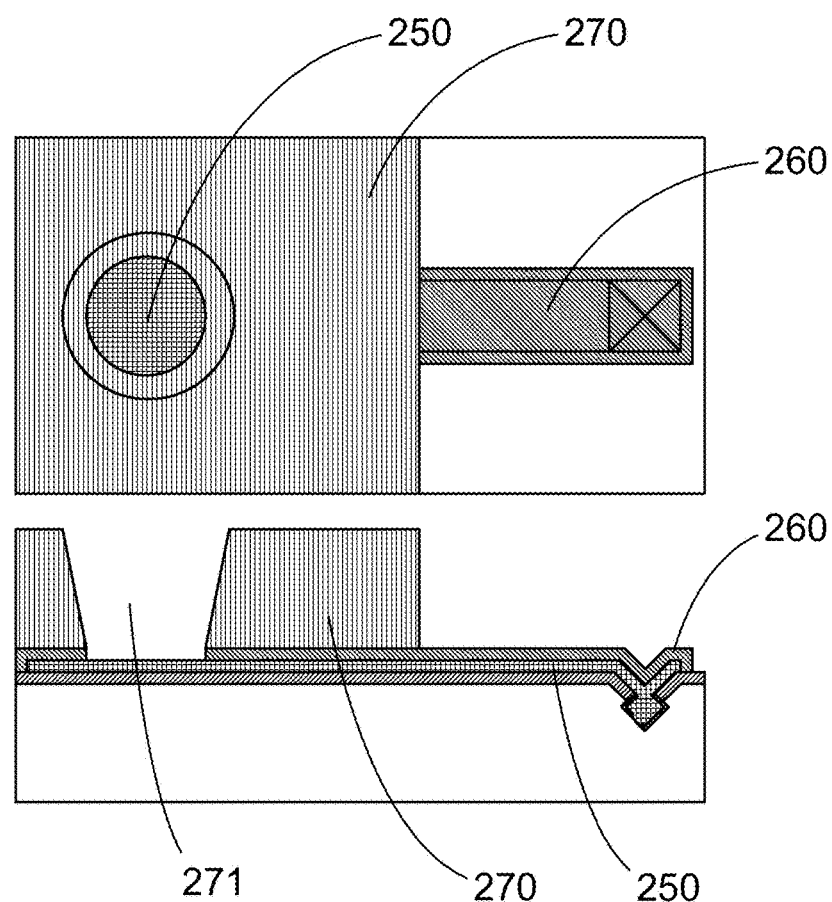

The further layer of material 260 is bonded to a glass cover 270 by anodic bonding (FIG. 2K). The glass cover 270 has a cover hole 271 (a through-hole) that will allow access of etchant to the polycrystalline sacrificial material at the location of the cover hole 271 and, once the silicon of the wafer has been etched away, at the through-hole 132.

Etching with hot Tetramethylammonium hydroxide (TMAH) solution results in the probe 100, shown in FIG. 1.

Figure 3:
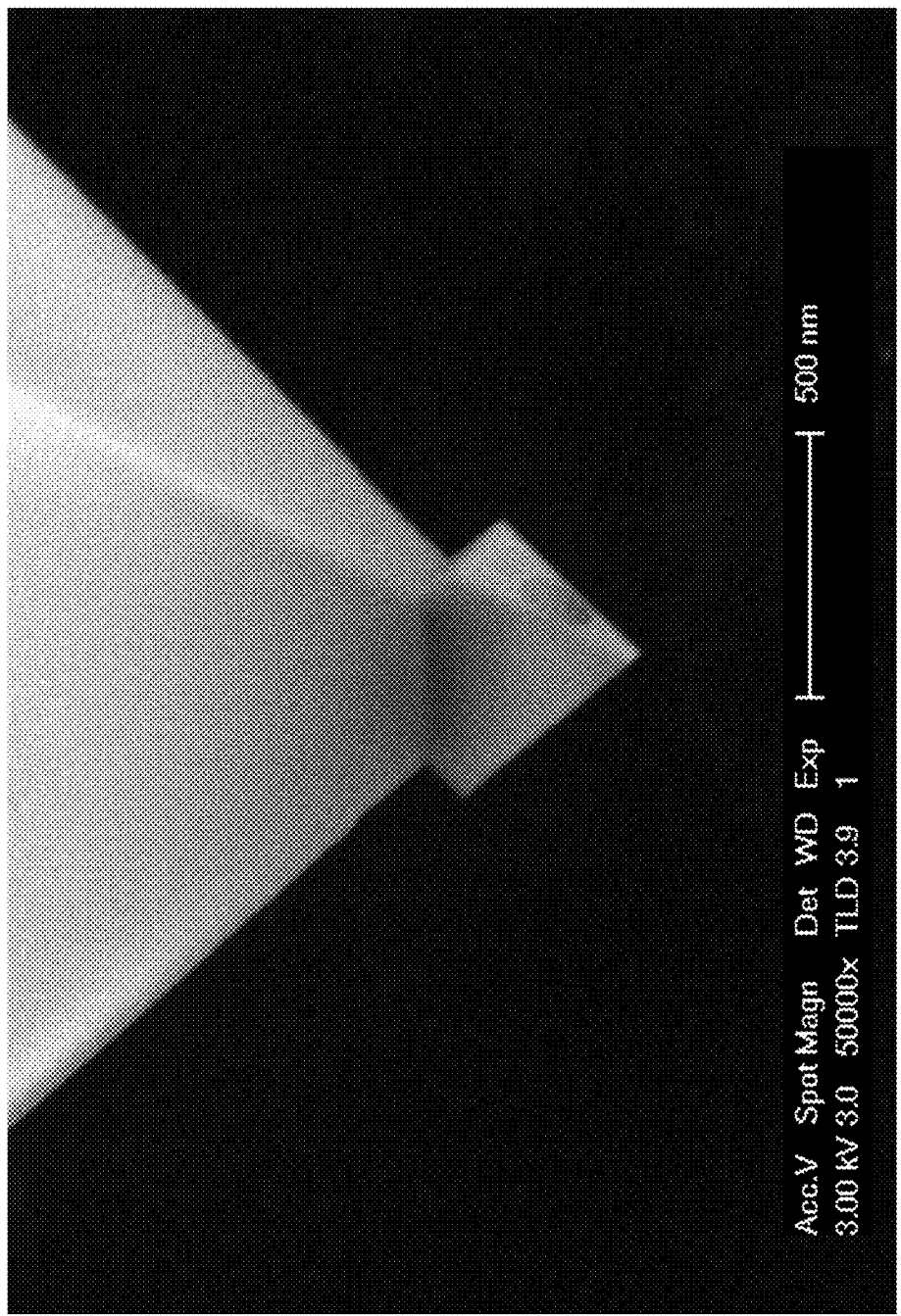
FIG. 3 shows a Scanning Electron Microscope image of a tip of a probe manufactured according to the invention.

FIG. 3A shows a Scanning Electron Microscope image of a pyramidal tip 130 of a probe 100 manufactured according to the invention. Part of the base of the pyramidal tip 130 and the octagonal tip section 131 with a through-hole 132 are visible.

The invention claimed is:

1. A method of manufacturing a plurality of through-holes in a layer of material, wherein an intermediate product is subjected to a plurality of method steps, the intermediate product
   defining a first side and a second side, and
   comprises a base substrate, said base substrate comprising a base material, wherein at the first side a surface of the base substrate defines a main plane;
wherein the plurality of method steps comprises the steps of
   providing the base substrate of the intermediate product at the first side with a plurality of pits in said base material, and
   providing the base substrate with a layer of first material at the first side of the intermediate product, the first material being different from the base material so as to result in the intermediate product having pits comprising a layer of said first material,
   providing a plurality of holes in the layer of first material at central locations of the pits,
   etching the base material at the central locations of the pits of the intermediate product so as to form a cavity separated from the first side by an aperture defining a waist,
   depositing a layer of second material on the base material in the cavity, the second material being different from the base material, and
   subjecting the first side of the base substrate provided with the layer of second material as the layer of material to a step of directional dry etching using the aperture as an opening of a shadow mask to provide through-holes in the layer of second material, wherein the step of directional dry etching using the aperture as the opening of the shadow mask, is performed with a direction of the dry etching being at a non-perpendicular angle to the main plane.

2. The method according to claim 1, further comprising removing base material of the base substrate exposing the through-holes in the layer of second material.

3. The method according to claim 1, wherein the method comprises at least one further method step for manufacturing a plurality of MEMS devices, a MEMS device comprising a through-hole in material of a wall of the cavity, said through-hole formed by the step of directional dry etching using the aperture as the opening of the shadow mask.

4. The method according to claim 3, wherein the method comprises further steps for manufacturing a plurality of probes wherein each probe of the plurality of probes comprises
   a probe base section
      having a probe base main plane, and
      comprising a first opening of a conduit; and a cantilever protruding from said probe base section parallel with the probe base main plane, said cantilever having
a proximal end connected to the probe base section, and a distal cantilever end;
said cantilever comprising a tip having a distal tip end, said tip comprising a second opening of said conduit at a location away from the distal tip end;
wherein the second opening is formed by at least one step comprising the step of directional dry etching using the aperture as the opening of the shadow mask.

5. The method according to claim 4, wherein the probe comprises a hollow cantilever.

6. The method according to claim 1, wherein the base material is a crystalline base material, and before the base substrate is provided with the layer of first material, the method comprises the step of
etching the base substrate at the first side to form a plurality of pits in said crystalline base material, the pits comprising a face that is at an angle to the main plane.

7. The method according to claim 1, wherein the step of directional dry etching is performed using reactive ion etching.

8. A method of manufacturing a plurality of through-holes in a layer of material, wherein an intermediate product is subjected to a plurality of method steps, the intermediate product
defining a first side and a second side, and
comprises a base substrate, said base substrate comprising a base material, wherein at the first side a surface of the base substrate defines a main plane;
wherein the plurality of method steps comprises the steps of
providing the base substrate of the intermediate product at the first side with a plurality of pits in said base material, and
providing the base substrate with a layer of first material at the first side of the intermediate product, the first material being different from the base material so as to result in the intermediate product having pits comprising a layer of said first material,
providing a plurality of holes in the layer of first material at central locations of the pits,
etching the base material at the central locations of the pits of the intermediate product so as to form a cavity separated from the first side by an aperture defining a waist,
depositing a layer of second material on the base material in the cavity, the second material being different from the base material, and
subjecting the first side of the base substrate provided with the layer of second material as the layer of material to a step of directional dry etching using the aperture as an opening of a shadow mask to provide through-holes in the layer of second material, wherein the step of directional dry etching using the aperture as the opening of the shadow mask, is performed with a direction of the dry etching being at an angle α to the normal to the main plane of at least 5°.

* * * * *